(12) United States Patent
Nittka

(10) Patent No.: US 11,047,945 B2
(45) Date of Patent: Jun. 29, 2021

(54) MAGNETIC RESONANCE PREVIEW IMAGE

(71) Applicant: Mathias Nittka, Baiersdorf (DE)

(72) Inventor: Mathias Nittka, Baiersdorf (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 359 days.

(21) Appl. No.: 15/068,552

(22) Filed: Mar. 12, 2016

(65) Prior Publication Data
US 2016/0266222 A1  Sep. 15, 2016

(30) Foreign Application Priority Data
Mar. 12, 2015  (DE) .......................... 102015204483.1

(51) Int. Cl.
  *G01R 33/48* (2006.01)
  *G01R 33/565* (2006.01)
  *G01R 33/561* (2006.01)
  *G01R 33/54* (2006.01)

(52) U.S. Cl.
  CPC ... *G01R 33/56536* (2013.01); *G01R 33/4824* (2013.01); *G01R 33/543* (2013.01); *G01R 33/5611* (2013.01)

(58) Field of Classification Search
  CPC ................. G01R 33/543; G01R 33/546; G01R 33/5608; G01R 33/5611; G01R 33/56536; G01R 33/4822; G01R 33/4818; G01R 33/4826; G01R 33/4824
  See application file for complete search history.

(56) References Cited

U.S. PATENT DOCUMENTS

| | | | | |
|---|---|---|---|---|
| 9,454,709 | B2* | 9/2016 | Saranathan | G06K 9/4633 |
| 10,401,463 | B2* | 9/2019 | Van Den Brink | G01R 33/56509 |
| 2006/0255801 | A1* | 11/2006 | Ikeda | G01R 33/54 324/307 |
| 2008/0054899 | A1* | 3/2008 | Aksoy | G01R 33/5611 324/307 |
| 2011/0148410 | A1* | 6/2011 | Zaitsev | G01R 33/5611 324/309 |
| 2011/0241676 | A1 | 10/2011 | Busse et al. | |

(Continued)

OTHER PUBLICATIONS

German Search Report for related German Application No. 10 2015 204 483.1, dated Feb. 17, 2016, with English Translation.
Koch, Kevin M. et al., "A Multispectral Three-Dimensional Acquisition Technique for Imaging Near Metal Implants", in: Magnetic Resonance in Medicine, vol. 61, 2009, pp. 381-390, DOI 10.1002/mrm.21856.

(Continued)

*Primary Examiner* — Rishi R Patel
(74) *Attorney, Agent, or Firm* — Lempia Summerfield Katz LLC

(57) ABSTRACT

Generation of a preview image using magnetic resonance signals is provided. A method for the generation of a preview image using magnetic resonance signals includes acquiring a first part and a second part of magnetic resonance signals. During the acquisition of the first part of the magnetic resonance signals, a first k-space is regularly sampled, while, during the acquisition of the second part of the magnetic resonance signals, a second k-space is sampled in a pseudorandomized manner. The first part of the magnetic resonance signals is used to generate a preview image. The second part or the second part and a subset of the first part of the magnetic resonance signals are stored for the generation of a second image.

19 Claims, 2 Drawing Sheets

(56) References Cited

U.S. PATENT DOCUMENTS

| | | | | |
|---|---|---|---|---|
| 2012/0262167 A1* | 10/2012 | Lai | ............... | G01R 33/5611 |
| | | | | 324/309 |
| 2013/0089271 A1* | 4/2013 | Boernert | ............... | G01N 24/08 |
| | | | | 382/274 |
| 2013/0099786 A1* | 4/2013 | Huang | ............... | G01R 33/246 |
| | | | | 324/309 |
| 2013/0278254 A1* | 10/2013 | Reeder | ............... | G01R 33/485 |
| | | | | 324/307 |
| 2014/0285195 A1* | 9/2014 | Stemmer | ............... | G01R 33/4818 |
| | | | | 324/309 |
| 2016/0154080 A1* | 6/2016 | Wiens | ............... | G01R 33/56536 |
| | | | | 324/309 |

OTHER PUBLICATIONS

Liu, J., et.al.: "Accelerated MRI with CIRcular Cartesian UnderSampling (CIRCUS): a variable density Cartesian sampling strategy for compressed sensing and parallel imaging," in: Quant Imaging Med Surg, vol. 4, Nr. 1, pp. 57-67, 2014.

Lu W. et al: "SEMAC: Slice Encoding for Metal Artifact Correction in MRI", Magnetic Resonance in Medicine 62, pp. 56-76, 2009.

Ravishankar, S. et. al.: "Adaptive Sampling Design for Compressed Sensing MRI", in: 33rd Annual International Conference of the IEEE EMBS Boston, 2011, pp. 3751-3755.

Butter R et al., "Reduction of Metal Artifacts in Patients with Total Hip Arthroplasty with Sliceencoding Metal Artifact Correction and View-Angle Tilting MR Imaging," Radiology, vol. 265, No. 1, pp. 204-214, 2012.

* cited by examiner

MAGNETIC RESONANCE PREVIEW IMAGE

This application claims the benefit of DE 10 2015 204 483.1, filed on Mar. 12, 2015, which is hereby incorporated by reference in its entirety.

BACKGROUND

The present embodiments relate to generation of a preview image using magnetic resonance signals.

It may be attempted to achieve a homogeneous main magnetic field in a region under examination of a magnetic resonance device in order to be able to generate high-quality images using magnetic resonance imaging (MRI). The superconducting main magnets commonly used nowadays produce homogeneity deviations in the order of magnitude of ±5 ppm. However, metallic objects within the region under examination may disrupt the homogeneity.

Imaging on patients with metallic orthopedic implants is becoming increasing important, partly due to a greatly increasing population of implant wears and the better soft-tissue contrast in MR measurements compared to other procedures, and partly due to new MR imaging methods that are increasingly more efficient at suppressing image distortion caused by an inhomogeneous main magnetic field in the vicinity of metal parts than was the case a few years ago.

However, often the use of new MR imaging methods of this kind is limited in routine clinical practice due to long measuring times, and hence, intensive work is being undertaken to speed things up using iterative reconstruction methods. Although this succeeds in speeding up the acquisition of magnetic resonance signals, the subsequent image reconstruction time is too long for practical use. For example, the reconstruction time with typical protocols is in the range of from 10 to 20 minutes. An operator carrying out magnetic resonance imaging is to check that the measurement has been carried out correctly before discharging a patient to be examined. A check using an image reconstructed in this way is not economical, and the lengthy waiting time is poorly tolerated by patients.

SUMMARY AND DESCRIPTION

The scope of the present invention is defined solely by the appended claims and is not affected to any degree by the statements within this summary.

The present embodiments may obviate one or more of the drawbacks or limitations in the related art. For example, a method, a device, and a computer program product enabling quick measurement using methods for correction of an inhomogeneous main magnetic field are provided.

A method according to one or more of the present embodiments includes the following acts for generation of a preview image (e.g., of a region under examination with an inhomogeneous main magnetic field) using magnetic resonance signals. A first part and a second part of magnetic resonance signals are acquired. During the acquisition of the first part of the magnetic resonance signals, a first k-space is regularly sampled, while during the acquisition of the second part of the magnetic resonance signals, a second k-space is sampled in a pseudorandomized manner. The first part of the magnetic resonance signals is used to generate a preview image. The second part or the second part and a subset of the first part of the magnetic resonance signals are stored for the generation of a second image.

The regularity of the sampling may be expressed in the fact that points sampled by the pulse sequence in the k-space (e.g., the spatial frequency space) are arranged regularly (e.g., periodically and/or uniformly). Regular sampling of the k-space may produce a regular sampling pattern, which, for example, includes sampling points with equidistant spacing in the k-space. Regular sampling may be suitable for the use of linear transformations for image generation.

Regular sampling of the k-space may be performed using a pulse sequence, which includes a plurality of segments. Only a few parameters (e.g., only one parameter such as a phase encoding gradient) may be varied from segment to segment. The segment of the pulse sequence may be a part of the pulse sequence that is stimulated by an initial excitation pulse to excite specific nuclear spins, which is followed by one or more readout processes that measure the resonance signals caused by the initial excitation pulse. Further RF pulses and/or gradient pulses may be switched between the initial excitation pulse and the last of the readout processes in order to modify the resonance signals.

Pseudorandomized sampling, which may also be referred to as pseudorandom and/or irregular, is performed using a perturbed pulse sequence. At least one parameter is greatly and/or irregularly varied during the course of the pulse sequence (e.g., from segment to segment). This results in an irregular sampling pattern in the k-space, which typically does not have any identifiable structure and/or periodicity. Pseudorandomized sampling of this kind may be suitable for the use of iterative reconstruction methods for image generation.

The volume of the first k-space may be smaller than the volume of the second k-space. For example, the second k-space may be made up of a plurality of individual k-spaces. The volume of one of the plurality of individual k-spaces may be as large as the first k-space. Due to a possibly smaller volume, the first k-space may be sampled particularly quickly.

Regular sampling is well suited for quick image reconstructions, so that the preview image is available to an operator immediately after the measurement. Although the preview image may have increased artifacts in the environment of any implants, the preview image may be assessed with respect to image contrast, image sharpness, slice orientation, anatomical coverage, motion artifacts, signal-to-noise ratio. Therefore, the operator may use this preview image to identify whether the measurement has been performed correctly and the patient can be discharged or whether, for example, the measurement is to be repeated because, for example, the patient moved during the measurement or made some other kind of mistake.

Pseudorandomized sampling (e.g., including a relatively large k-space volume) is particularly suitable for reconstruction methods suitable for correcting distortion caused by inhomogeneous magnetic fields such as those that may, for example, be caused by implants in the body of the patient.

For the generation of a second image, the second part or the second part and a subset of the first part of the magnetic resonance signals are stored. The subset of the first part may also include the entire first part. In one embodiment, the subset of the first part to be stored only includes the magnetic resonance signals required for the generation of the second image.

The storage of the second part or of the second part and the subset of the first part of the magnetic resonance signals for the generation of a second image may be permanent and/or volatile. Permanent storage may, for example, be provided by a memory unit including a data carrier, such as, for example, a hard disk and/or a diskette and/or a CD-ROM and/or an USB stick. This is advantageous when there is a time gap until the generation of the second image for the acquisition of the magnetic resonance signals. However, for the storage of the magnetic resonance signals, the memory unit may also include a volatile storage medium such as, for example, a working memory of a computing unit (e.g., a computer). This is advantageous if the generation of the second image is to be performed immediately following, or even in parallel with, the recording process. A combination of permanent and volatile storage may also be provided.

The method according to one or more of the present embodiments may also be applied to several slices of an object to be examined (e.g., the method is applied several times in order to obtain one or more preview images for each of the slices to be measured).

In one embodiment, the generation of the preview image is performed at least partially at the same time as the acquisition of the second part of the magnetic resonance signals. The first part of the magnetic resonance signals is recorded first so that the first part of the magnetic resonance signals is available for the generation of the preview image.

The generation of the preview image may be performed at least partially parallel to the acquisition of the second part of the magnetic resonance signals. This may have the result that the preview image may be generated particularly quickly and made available to an operator, for example, as speedily as possible.

The method may include an additional act in which the second part or the second part and the subset of the first part of the magnetic resonance signals are used to generate a second image.

Image generation of this kind may also be performed subsequently to the measurement since, at the time of the measurement, diagnosis and findings may not be of prime importance. Therefore, a lengthy reconstruction time for the generation of the second image is not critical. An assessment, for example, by a radiologist may then be performed using the second image, which advantageously has reduced distortion artifacts compared to the preview image.

According to an aspect, the resolution of the preview image is the same or higher than the resolution of the second image. The resolution is, for example, a spatial resolution (e.g., a number of pixels per area and/or volume).

The same resolution may, for example, result from the fact that the expansion of the sampled first and second k-space parallel to a k-space plane is of the same size (e.g., the same expansion in the y-direction may provide the same image resolution in the y-direction). For example, the k-space plane may be spanned by phase encoding in the y-direction perpendicular to a slice selection in the z-direction and frequency encoding in the x-direction perpendicular to the y- and z-directions. The overall volume of the first and second k-spaces may nevertheless differ, possibly due to a different expansion of the k-spaces in the z-direction.

As a result, the image quality of the preview is close to the image quality of the second image, is equally as good, or better. Hence, the preview image according to one or more of the present embodiments differs from usual preview images with conventional methods in which the image resolution is often reduced in order to reduce image reconstruction time.

In one embodiment, a number of coil channels for the acquisition of the first part of the magnetic resonance signals is the same or higher than for the acquisition of the second part of the magnetic resonance signals. Frequently, each coil channel is connected in each case to a coil of the radio-frequency antenna unit that is embodied to receive radio-frequency magnetic resonance signals. However, other systems in which signals from a plurality of coils may be conducted via one coil channel may also be provided. Typically, the number of coil channels used influences the data volume (e.g., the higher the number of coil channels used, possibly the higher the quantity of data to be dealt with).

With the method according to one or more of the present embodiments, the number of coil channels used remains constant (e.g., during the acquisition of a first part of the magnetic resonance signals, exactly the same number of coil channels is used during the acquisition of a second part of the magnetic resonance signals). This is, for example, also advantageous when the data in the first part of the magnetic resonance signals is used to generate the second image. In this way, the method according to one or more of the present embodiments differs from conventional methods in which it is usual to reduce the number of coil channels used for the preview image.

Also provided is an embodiment with which the acquisition of the first part of the magnetic resonance signals is performed according to a first averaged sampling density and the acquisition of the second part of the magnetic resonance signals according to a second averaged sampling density. The first averaged sampling density is greater than the second averaged sampling density.

A sampling density may be a number of acquired sampling points N per k-space volume V and/or per k-space area A and/or per k-space line S. The averaged sampling density N/V and/or N/A and or N/S may be the sampling density with a k-space volume V and/or k-space area A and/or k-space line S including the entire k-space volume sampled by the measurement and/or the entire k-space area and/or the entire k-space line or a greater part thereof (e.g., at least half or at least one quarter thereof).

A larger averaged sampling density during the acquisition of the first part of the magnetic resonance signals results in a larger data and/or information density, enabling a quick and simple generation of the preview image.

The lower averaged sampling density may speed up the acquisition of the second part of the magnetic resonance signals, thus achieving a quick and hence economic overall measuring time. The longer time used for a possible generation of the second image possibly resulting from the lower averaged sampling density is insignificant since an evaluation of the second image (e.g., by a doctor) may also be performed later without delaying the work sequence.

A further embodiment provides that the acquisition of the first part and the second part of the magnetic resonance signals is performed according to a pulse sequence with at least one sequence object, which occurs sequentially in different manifestations within the pulse sequence. The acquisition of the first part of the magnetic resonance signals is performed using the at least one sequence object in only one of the different manifestations, while the acquisition of the second part of the magnetic resonance signals is performed using the at least one sequence object in at least one (e.g., two) of the further different manifestations.

A pulse sequence may be interpreted as a sequence of sequence objects, such as, for example, RF pulses and/or gradient pulses (e.g., phase encoding gradients, frequency encoding gradients (a readout gradient), and/or slice selection gradients). In this case, such sequence objects may occur in different manifestations within the pulse sequence (e.g., gradient pulses may be manifested differently with respect to their amplitude and/or duration). RF pulses, also known as excitation pulses, may, for example, have different frequencies and/or bandwidths.

The restriction of the acquisition of the first part of the magnetic resonance signals to the use of the at least one sequence object in only one of the different manifestations enables quick, but still sufficient, data acquisition for the generation of the preview image. The possible variation of the at least one sequence object during the acquisition of the second magnetic resonance signals enables the generation of a wide database, which is suitable for a possible generation of the second image.

Also provided is an embodiment according to which the at least one sequence object is a phase encoding gradient in one slice selection direction and the manifestation of the sequence object is the moment of the phase encoding gradient in the slice selection direction, and/or the at least one sequence object is an RF pulse and the manifestation of the sequence object is the frequency of the RF pulse.

For the slice selection, a slice selection gradient may be switched at the same time as an RF pulse (e.g., an inconstant, rising or falling (linearly rising or linearly falling) magnetic field is generated parallel to a slice selection direction. This may have the result that magnetic resonance signals are only generated in a desired slice, which may have a specific slice thickness in the slice selection direction, perpendicular to the slice selection direction.

The application of a phase encoding gradient in the slice selection direction between an exciting RF pulse and a frequency encoding gradient for reading out the magnetic resonance signal may achieve spatial encoding of the magnetic resonance signal in the slice selection direction. This spatial encoding is dependent upon the moment of this phase encoding gradient. During a switching time, a gradient may have one gradient amplitude. The moment of a gradient may be the integral of the gradient amplitude over the switching time of the gradient.

The recording of differentially phase-encoded magnetic resonance signals in the slice selection direction and/or of magnetic resonance signals arising from RF pulses of a different frequency may be used to obtain valuable information for an evaluation of the magnetic resonance signals, which may, for example, be used within the framework of a slice encoding for metal artifact correction (SEMAC) method and/or a multi-acquisition variable-resonance image combination (MAVRIC) method.

At least one sequence object for the acquisition of the first part of the magnetic resonance signals may be manifested such that the moment of the phase encoding gradient in the slice selection direction is equal to zero, and/or the frequency of the RF pulse is a central frequency.

If the main magnetic field experiences local disruption, for example, due to a metallic implant, and, as a result, displays inhomogeneity, the central frequency may be defined as the frequency that is identical to a resonance frequency in an undisrupted range of the main magnetic field. The resonance frequency may be the frequency with which nuclei (e.g., hydrogen nuclei) may be excited by nuclear spin resonance.

Since usually no a priori information on a possible distortion of the main magnetic field is available, an undisrupted or little-distorted main magnetic field may be a starting point for the determination of a preview image. Therefore, the two manifestations mentioned are suitable for the acquisition of magnetic resonance signals to be used for the generation of the preview image.

According to an embodiment, a plurality of phase encoding gradients is switched sequentially for phase encoding in the slice selection direction. In this case, for each of the plurality of phase encoding gradients for the phase encoding in a slice selection direction (e.g., also called the z-direction), further phase encoding gradients are switched for phase encoding in a second direction (e.g., the y-direction), perpendicular to the slice selection direction, and readout gradients for frequency encoding are switched in a direction (e.g., the x-direction), perpendicular to the slice selection direction and to the second direction. In this case, the acquisition of the first part of the magnetic resonance signals is performed with at least one of the plurality of phase encoding gradients for the phase encoding in the slice selection direction with a moment equal to zero. The acquisition of the second part of the magnetic resonance signals is performed with at least one (e.g., two) of the plurality of phase encoding gradients for the phase encoding in the slice selection direction with a moment unequal to zero. This acquisition provides advantageous data for the generation of the preview image and a possible second image (e.g., with the aid of the SEMAC method).

In one embodiment, the generation of the preview image is performed by a linear transformation, since these are particularly suitable for quick image reconstructions (e.g., the preview image may be displayed to an operator of the magnetic resonance device immediately after the recording of the data for checking).

In one embodiment, the Linear transformation includes a fast Fourier transformation (FFT) and/or a PAT reconstruction (parallel acquisition technique).

Usual PAT reconstructions are SMASH (SiMultaneous Acquisition of Spatial Harmonics), GRAPPA (GeneRalized Autocalibrating Partially Parallel Acquisitions) and SENSE (SENSitivity Encoding). Other variants may be provided. By subsampling the k-space, PAT enables a reduction of the measuring time without any losses in the image resolution and/or the size of the field of view (FoV).

In one embodiment, the generation of the second image is performed according to an iterative reconstruction method.

Iterative reconstruction methods enable the processing of greatly subsampled k-spaces (e.g., data may be reconstructed for which the recording only requires very little measuring time).

In one embodiment, the generation of the second image is performed according to a SEMAC method or a MAVRIC method or a combination of a SEMAC method with a MAVRIC method.

These methods are suitable for using the second part or the first part and the second part of the magnetic resonance signals to process an image such that distortion artifacts, caused, for example, by an implant in the body of the patient are corrected, as is known from the publications Koch et al., A Multi-Spectral Three-Dimensional Acquisition Technique for Imaging near Metal Implants, Proc. Intl. Soc. Mag. Reson. Med. 17 (2009) 4545, Lu et al., SEMAC: Slice Encoding for Metal Artifact Correction in MRI, Magn Reson Med. 62 (2009) 66-76 and Sutter et al., Reduction of Metal Artifacts in Patients with Total Hip Arthroplasty with Slice-Encoding Metal Artifact Correction and View-Angle Tilting MR Imaging, Radiology 265 (2012) 204-214.

The pulse sequence used includes at least one sequence object that occurs sequentially in different manifestations. With the SEMAC method, a phase encoding gradient may be varied in the slice selection direction. With the MAVRIC method, a plurality of 3D measurements may be performed with different offsets of the excitation frequency.

According to a further aspect, —a method includes acquisition of a first part of the magnetic resonance signals, acquisition of a second part of the magnetic resonance signals, generation of a preview image using the first part of the magnetic resonance signals, storage of the second part or the second part and a subset of the first part of the magnetic resonance signals for the generation of a second image, and generation of a second image using the second part or the second part and the subset of the first part of the magnetic resonance signals for different slices of an object to be examined. Slice coverage of the preview images is the same as slice coverage of the second images. The slice coverage of the preview images may also be larger than the slice coverage of the second images.

Slice coverage may, for example, be the generally spatial range that is acquired by the total number of the slices measured. For example, in the event that a plurality of slices are to be measured, a preview image may be created for each of these slices so that high quality control of the performance of the measurement may be provided over the entire spatial range to be measured.

In this way, the method according to one or more of the present embodiments differs from conventional methods, in which slice coverage is often reduced in order to achieve an acceleration of the measuring and or evaluation process, in that, for example, a preview image is only created for one slice (e.g., a central slice) out of a plurality of slices.

The following describes a magnetic resonance device according to one or more of the present embodiments for the generation of a preview image using magnetic resonance signals. The advantages thereof substantially correspond to the advantages of the method for the generation of a preview image using magnetic resonance signals, which were described above in detail. Any features, advantages or alternative embodiments may also be applied to the other subject matter. In other words, the magnetic device may also be developed with the features described in connection with a method. The corresponding functional features of the method are embodied by corresponding substantive modules (e.g., by hardware modules).

A magnetic resonance device according to one or more of the present embodiments for the generation of a preview image using magnetic resonance signals is embodied to carry out an embodiment of a method. —The magnetic resonance device includes a radio-frequency antenna unit configured to acquire a first part and a second part of the magnetic resonance signals. The magnetic resonance device also includes a system control unit or controller configured to perform a pulse sequence with regular sampling of a k-space for the acquisition of the first part of the magnetic resonance signals and pseudorandomized sampling of a k-space for the acquisition of the second part of the magnetic resonance signals. The system control unit is also configured to generate a preview image using the first part of the magnetic resonance signals.

In addition, a computer program product is provided. The computer program product includes a memory (e.g., a non-transitory computer-readable storage medium) that stores a program of instructions loadable directly into a memory of a programmable system control unit of a magnetic resonance device. The instructions includes, for example, libraries and auxiliary functions, in order to carry out a method according to one or more of the of the present embodiments when the computer program product is executed in the system control unit (e.g., by one or more processors) of the magnetic resonance device.

In this case, the computer program product may be software with a source code that is to be compiled and linked or only is to be interpreted, or includes an executable software code that only needs to be loaded into the system control unit in order to be executed. The computer program product may carry out the method according to one or more of the present embodiments quickly, with identical reproducible conditions and robustly. The computer program product is configured such that the computer program product is able to carry out method acts using the system control unit. In this case, the system control unit is to satisfy the preconditions such as, for example, a corresponding working memory, a corresponding graphics card or a corresponding logic unit, so that the respective method acts may be carried out efficiently. The computer program product is, for example stored, on a computer-readable medium (e.g., a non-transitory computer-readable storage medium) or on a network or server from where the computer program product may be loaded into the processor of a local system control unit, which may be connected directly to the magnetic resonance device or embodied as part of the magnetic resonance device. In one embodiment, control information for the computer program product may be stored on an electronically readable data carrier. The control information for the electronically readable data carrier may be embodied such that, when the data carrier is used in a system control unit of a magnetic resonance device, the data carrier carries out a method according to one or more of the present embodiments. Examples of electronically readable data carriers are a DVD, a magnetic tape or an USB stick, on which electronically readable control information (e.g., software) is stored. If this control information is read by the data carrier and stored in a system control unit of the magnetic resonance device, all the embodiments of the above-described method may be carried out. Hence, one or more of the present embodiments may also be based on the computer-readable medium and/or the electronically readable data carrier.

BRIEF DESCRIPTION OF THE DRAWINGS

Corresponding parts are given the same reference numbers in all the figures, which show.

DETAILED DESCRIPTION

Figure 1:
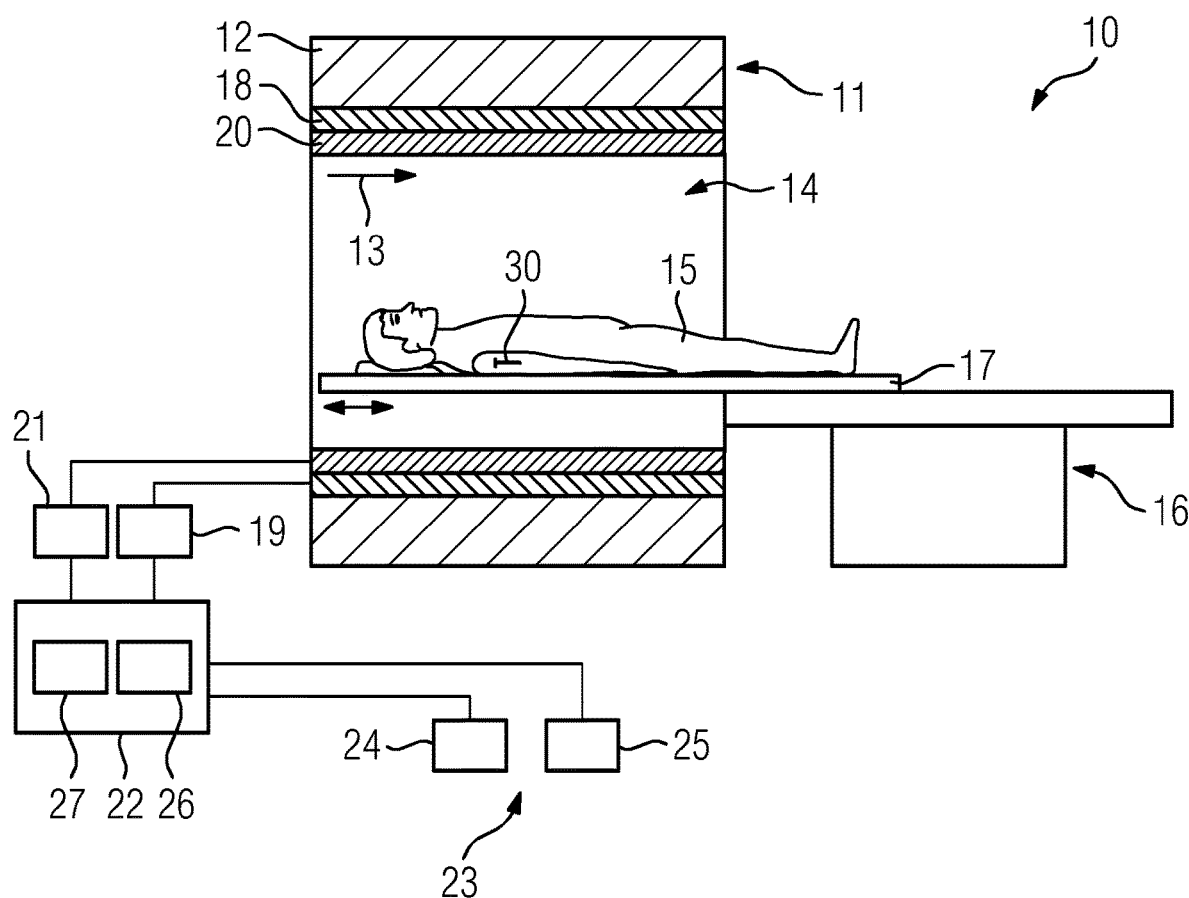
FIG. 1 shows one embodiment of a magnetic resonance device in a schematic diagram.

FIG. 1 is a schematic diagram of a magnetic resonance device 10. The magnetic resonance device 10 includes a magnetic unit 11. The magnetic unit 11 includes a superconducting main magnet 12 for the generation of a strong and, for example, temporally constant main magnetic field 13. The magnetic resonance device 10 also includes a patient receiving area 14 for receiving a patient 15. The patient 15 has a metallic orthopedic implant 30 that disrupts the homogeneity of the main magnetic field 13. In the present exemplary embodiment, the patient receiving area 14 has a cylindrical shape and is surrounded in a circumferential direction by the magnetic unit 11 in a cylindrical shape. However, an embodiment of the patient receiving region 14 deviating therefrom may be provided. The patient 15 may be pushed by a patient support device 16 of the magnetic resonance device 10 into the patient receiving area 14. The patient support device 16 includes a patient table 17 that may be moved within the patient receiving region 14.

The magnetic unit 11 further includes a gradient coil unit 18 for generating magnetic field gradients that are used for spatial encoding during imaging. The gradient coil unit 18 is controlled by a gradient control unit 19 of the magnetic resonance device 10 and includes a plurality of gradient coils (not shown in further detail) that may be controlled by coil channels. The magnetic unit 11 also includes a radio-frequency antenna unit 20 that, in the present exemplary embodiment, is embodied as a body coil permanently integrated in the magnetic resonance device 10. The radio-frequency antenna unit 20 is configured for the excitation of atomic nuclei, which is established in the main magnetic field 13 generated by the main magnet 12. The radio-frequency antenna unit 20 is controlled by a radio-frequency antenna control unit 21 of the magnetic resonance device 10 and irradiates RF pulses into an examination chamber, which is substantially formed by a patient receiving area 14 of the magnetic resonance device 10. The radio-frequency antenna unit 20 is also embodied to receive magnetic resonance signals.

To control the main magnet 12 and to control the radio-frequency antenna control unit 21, the gradient control unit 19 and the magnetic resonance device 10, respectively, include a system control unit 22. The system control unit 22 centrally controls the magnetic resonance device 10, for example, for the performance of a predetermined imaging pulse sequence. The system control unit 22 also includes a memory unit 27 for the storage of magnetic resonance signals acquired during the magnetic resonance examination and a processor unit 26 for the generation of images using the stored magnetic resonance signals. In addition, the magnetic resonance device 10 includes a user interface 23 that is connected to the system control unit 22. Control information such as, for example, imaging parameters and reconstructed magnetic resonance images may be displayed on a display unit 24 (e.g., on at least one monitor) of the user interface 23 for a medical operator. The user interface 23 also includes an input unit 25 by which the medical operator may input information and/or parameters during a measuring process.

Figure 2:
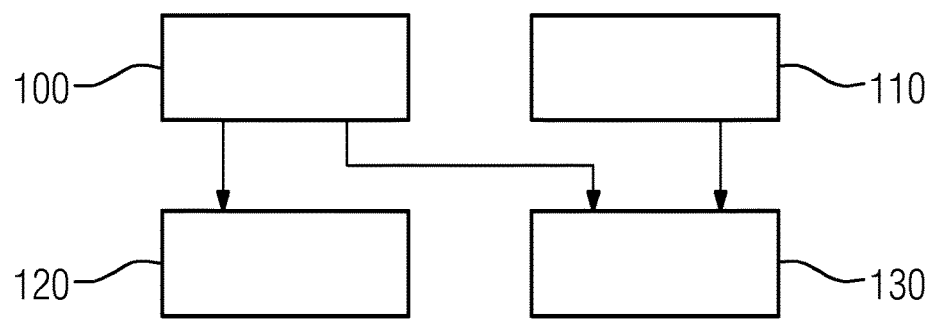
FIG. 2 shows one embodiment of a method in a schematic block diagram.

Together with the system control unit 22, the magnetic resonance device 10 is configured to carry out a method according to one or more of the present embodiments for the generation of a preview image using magnetic resonance signals, as shown schematically in FIG. 2. The system control unit 22 includes corresponding software and/or computer programs that may be loaded into a memory of the system control unit 22 with a program in order to execute the method for the generation of a preview image using magnetic resonance signals when the program is executed in the system control unit 22 of the magnetic resonance device 10.

FIG. 2 shows one embodiment of a method for the generation of a preview image using magnetic resonance signals. The radio-frequency antenna unit 20 is used to record a first part of the magnetic resonance signals in act 100 and a second part in act 110. The sequence of acts 100 and 110 is not significant (e.g., act 100 may take place before Step 110 or vice versa). Acts 100 and 110 may also be temporally interleaved with one another (e.g., part of act 100 is executed runs before a part of 110 and vice versa).

In act 120, a preview image is generated from the first part of the magnetic resonance signals using the processor unit 26, which is made available to the medical operator, for example, via the display unit 24. The medical operator may use the preview image to decide whether sufficiently good measured data has been acquired.

To provide that the preview image is available to the medical operator as quickly as possible, the generation of the preview image in act 120 takes place at least partially at the same time as the acquisition of a second part of the magnetic resonance signals in act 110. In one embodiment, act 100 takes place before act 110.

Figure 3:
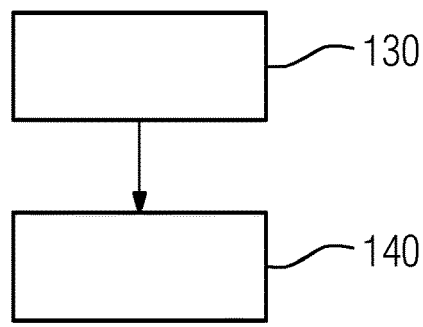
FIG. 3 shows an extension of the method in a schematic block diagram.

In act 130, the magnetic resonance signals from act 110 and possibly also from act 110 are stored by the memory unit 27 so that the magnetic resonance signals are available for a possible generation of a second image by the processor unit 26. The possible generation of the second image is depicted in FIG. 3 as act 140 as an extension of the method according to one or more of the present embodiments.

Figure 4:
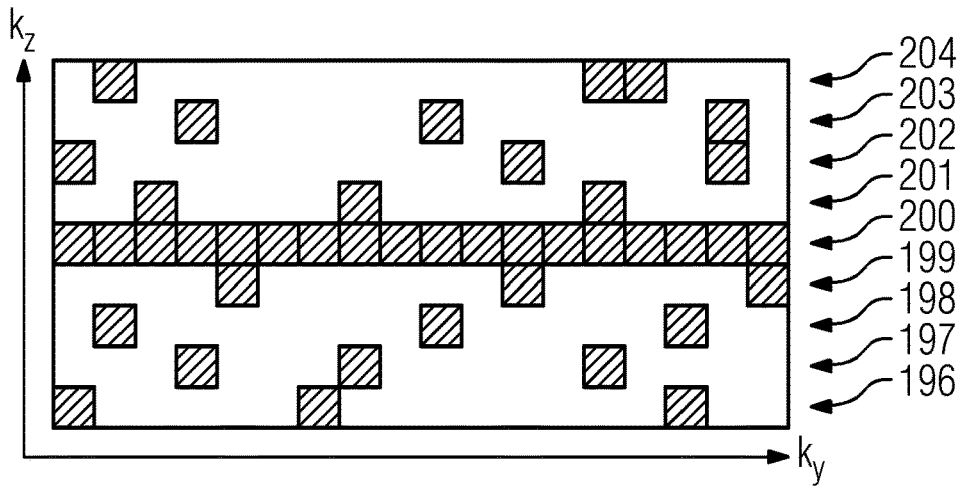
FIG. 4 shows an exemplary SEMAC phase encoding mask with full sampling in a central line and pseudorandomized subsampling in the other lines.

FIG. 4 is a schematic depiction of a two-dimensional phase encoding matrix according to one or more of the present embodiments, where phase encoding is performed in the y- and z-directions. The y-direction and the z-direction are perpendicular to one another and span a y-z plane of a k-space. With a SEMAC method, a phase encoding matrix of this kind may be used with iterative reconstruction and/or compressed sensing in combination with a quickly generated preview image.

In this example, the z-direction is also a slice selection direction (e.g., during the irradiation of the RF pulses by the radio-frequency antenna unit 20, a slice selection gradient is switched by the gradient coil unit 18 in the z-direction so that resonant excitation of the atomic nuclei in the patient's body 15 only takes place in a slice perpendicular to the z-direction).

In an x-direction (not shown here), which is aligned perpendicular to the y-z plane, frequency encoding takes place by the switching of a readout gradient (e.g., a frequency encoding gradient) by the gradient coil unit 18 during the readout processes of the pulse sequence. Hence, the y-z plane is a plane of a three-dimensional k-space that is spanned by the x-, y- and z-axes.

For the encoding of the k-space in the z-direction, for the acquisition of each of Lines 196, 197, 198, 199, 200, 201, 202, 203 and 204, a phase encoding gradient with a specific gradient moment is in each case switched sequentially with the aid of the gradient coil unit 18 (e.g., for Line 196, a first phase encoding gradient with a first gradient moment is switched, for Line 197, a second phase encoding gradient with a second gradient moment is switched, etc.). In other words, within the pulse sequence, a sequence object (e.g., the phase encoding gradient in the z-direction) occurs sequentially in a different manifestation (e.g., the moment of the phase encoding gradient).

While subsampling in the frequency encoding direction, x would result in no or no significant reduction in the measuring time, the subsampling of the k-space in Lines 196, 197, 198, 199, 201, 202, 203 and 204 of the y-z plane depicted results in a reduced measuring time compared to a fully sampled k-space. This is advantageous for the economic operation of a magnetic resonance device 10. The subsampling of these lines is, for example, performed with a subsampling factor of six (e.g., on average only every sixth matrix element is sampled).

In addition, the sampling of these Lines 196, 197, 198, 199, 201, 202, 203 and 204, which represent the second part of the acquired magnetic resonance signals, is performed in a pseudorandomized manner (e.g., the sampling pattern does not have a regular structure). A pseudorandomized sampling of this kind is suitable for image generation by iterative reconstruction methods. Advantageous subsampling factors for iterative reconstruction methods lie within a range of from four to sixteen (e.g., in a range of from four to eight).

In this case, Line 200 represents the first part of the acquired magnetic resonance signals. The matrix elements are fully sampled and are therefore particularly suitable for image generation using a linear transformation such as, for example, a fast Fourier transformation.

Figure 5:
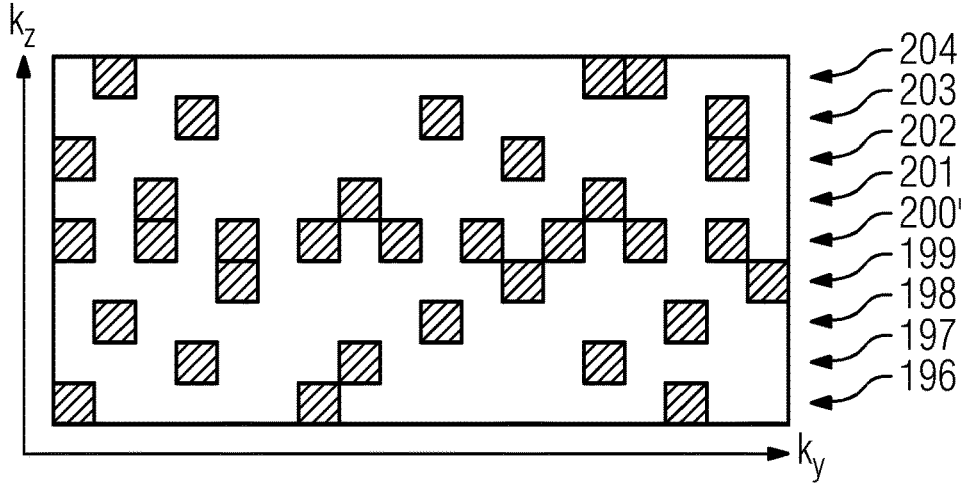
FIG. 5 shows an exemplary SEMAC phase encoding mask with regular subsampling in a central line and pseudorandomized subsampling in the other lines.

Full sampling of the central line, which may also be termed a partition, causes the overall measuring time to be extended compared to k-space-sampling with which the central line would also be subsampled in a pseudorandomized manner. In order to compensate this disadvantage at least partially, the central line may be subsampled with a regular scheme, as illustrated in FIG. 5. This shows a further phase encoding matrix, which differs from the phase encoding matrix shown in FIG. 4 in that the central Line 200' is subsampled regularly (e.g., every second point is acquired). Acquisition of this kind is suitable, for example, for image generation using a PAT reconstruction, which may be considered to be a further form of linear transformation. Typical PAT reconstruction methods are SMASH, GRAPPA and SENSE. Advantageous subsampling factors for PAT reconstruction methods lie within a range of from two to four.

In Lines 196, 197, 198, 199, 201, 202, 203 and 204, which represent the second part of the magnetic resonance signals, the two phase encoding matrices shown in FIGS. 4 and 5 have a lower averaged sampling density than that in Line 200 in FIGS. 4 and 200' in FIG. 5, which each represent the first part of the magnetic resonance signals. This enables the volumetrically larger second part to be measured particularly quickly. However, the sampling density of the first and second part of the magnetic resonance signals may be the same, and the only difference may be the regularity of the sampling.

The lower averaged sampling density does not exclude the possibility that locally (e.g., in some places and/or regions) the sampling density in the second part of the magnetic resonance signals may also be the same or even higher than in the first part of the magnetic resonance signals. However, over the entire k-space volume (e.g., going beyond each individual line), the sampling grid of the first part is narrower.

As illustrated with the two phase encoding matrices shown in FIGS. 4 and 5, the acquisition of the first part of the magnetic resonance signals using the at least one sequence object (e.g., the phase encoding gradient in the slice selection direction) is performed in only one of the different manifestations (e.g., only for a specific gradient moment corresponding to Lines 200 and 200'). This specific gradient moment may, for example, be equal to zero.

The acquisition of the second part of the magnetic resonance signals is performed using the at least one sequence object (e.g., the phase encoding gradient in the slice selection direction) in at least one further one of the different manifestations (e.g., for eight different gradient moments), which correspond to the six Lines 196, 197, 198, 199, 201, 202, 203 and 204. If the gradient moment for recording the first part of the magnetic resonance signals is equal to zero, then the gradient moments for recording the second part of the magnetic resonance signals are unequal to zero and, for example, have at least partially equidistant spacing.

An acquisition method of this kind is suitable in order to carry out the SEMAC method for the correction of distortion artifacts, which are caused by one or more inhomogeneities of the main magnetic field 13. In this case, in act 140, a distortion-reduced second image may be generated from the measured three-dimensional k-space data depicting a slice in the body of the patient 15. Thus, as a result, two image types are obtained (e.g., a quickly reconstructed preview image without SEMAC correction and without iterative reconstruction and a slowly reconstructed second image with SEMAC correction and iterative reconstruction).

One sampling scheme according to one or more of the present embodiments may also differ from the schemes depicted in FIGS. 4 and 5, for example, in that the one sampling scheme includes a fully sampled central range (not shown here), for example, for the autocalibration of coil profiles for iterative reconstruction using SENSE, without deviating from the present embodiments.

The above-described approach for the SEMAC method may be transferred very easily to the MAVRIC method. With MAVRIC, a plurality of three-dimensional measurements are performed with different frequency offsets of the exciting RF pulses, which may be irradiated by the radio-frequency antenna unit 20. The RF pulses correspond to the at least one sequence object, which occurs sequentially in different manifestations (e.g., with different frequency offsets).

In the case of the MAVRIC variant, the measurement would be sampled with a, for example, central frequency regularly (e.g., fully) and would be reconstructed separately as a preview image without distortion correction, similarly to the central Lines 200 or 200' with the SEMAC method. The central frequency measurement may be sped up with parallel imaging (PAT). In one embodiment, a combination of a SEMAC method with a MAVRIC method may be provided.

Compared to conventional preview images, the preview image generated according to one or more of the present embodiments offer the advantage of high image quality. Conventionally, long reconstruction times are avoided by the reduction of, for example, image resolution, slice coverage, and/or coil channels, although this also reduces the image quality of the preview image. In the event of the generation of the preview image using iterative reconstruction, the reconstruction time may be reduced by reducing any iteration steps. However, this would also significantly impair the quality of the preview image so that it would no longer be possible to assess the image quality of a possible second image, for example, due to motion artifacts.

Although the invention was described and illustrated in more detail by the exemplary embodiments, the invention is not restricted by the disclosed examples, and other variations may be derived herefrom by the person skilled in the art without departing from the scope of protection of the invention.

The elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent. Such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A method for the generation of a preview image of a region under examination using magnetic resonance signals, the method comprising:
   acquiring a first part of the magnetic resonance signals;
   acquiring a second part of the magnetic resonance signals;
   generating, by a magnetic resonance imager, the preview image using only the first part of the magnetic resonance signals, the preview image being displayed to an operator of the magnetic resonance imager such that an image quality of the preview image is evaluatable in order to determine whether the acquiring of the first part of the magnetic resonance signals or the acquiring of the second part of the magnetic resonance signals needs to be repeated; and
   storing, in a memory, the second part of the magnetic resonance signals or storing, in the memory, the second part and a subset of the first part of the magnetic resonance signals for generation of a second image,
   wherein during the acquiring of the first part of the magnetic resonance signals, a first part of a k-space is regularly sampled by the magnetic resonance imager, and during the acquiring of the second part of the magnetic resonance signals, a second part of the k-space is sampled by the magnetic resonance imager in a pseudorandomized manner.

2. The method of claim 1, wherein the generation of the preview image is performed at least partially at a same time as the acquiring of the second part of the magnetic resonance signals.

3. The method of claim 1, further comprising generating the second image using the second part or the second part and the subset of the first part of the magnetic resonance signals.

4. The method of claim 3, wherein a resolution of the preview image is the same or higher than a resolution of the second image.

5. The method of claim 1, wherein a number of coil channels for the acquisition of the first part of the magnetic resonance signals is the same or higher than for the acquisition of the second part of the magnetic resonance signals.

6. The method of claim 1, wherein the acquisition of the first part of the magnetic resonance signals is performed according to a first averaged sampling density,
   wherein the acquisition of the second part of the magnetic resonance signals is performed according to a second averaged sampling density, and
   wherein the first averaged sampling density is greater than the second averaged sampling density.

7. The method of claim 1, wherein the acquisition of the first part of the magnetic resonance signals and the acquisition of the second part of the magnetic resonance signals is performed according to a pulse sequence with at least one sequence object, which occurs sequentially in different manifestations within the pulse sequence,
   wherein the acquisition of the first part of the magnetic resonance signals is performed using the at least one sequence object in only one of the different manifestations, and
   wherein the acquisition of the second part of the magnetic resonance signals is performed using the at least one sequence object in at least one of the further different manifestations.

8. The method of claim 7, wherein the at least one sequence object is a phase encoding gradient in a slice selection direction and the manifestation of the sequence object is a moment of the phase encoding gradient in the slice selection direction, the at least one sequence object is an RF pulse and the manifestation of the sequence object is a frequency of the RF pulse, or a combination thereof.

9. The method of claim 8, wherein the at least one sequence object for the acquisition of the first part of the magnetic resonance signals is manifested such that the moment of the phase encoding gradient in the slice selection direction is equal to zero, the frequency of the RF pulse is a central frequency, or a combination thereof.

10. The method of claim 1, further comprising switching a plurality of phase encoding gradients sequentially for phase encoding in a slice selection direction,
    wherein for each phase encoding gradient of the plurality of phase encoding gradients for the phase encoding in the slice selection direction, the method further comprises:
       switching further phase encoding gradients for a phase encoding in a second direction perpendicular to the slice selection direction; and
       switching readout gradients for a frequency encoding in a direction perpendicular to the slice selection direction and to the second direction,
    wherein the acquisition of the first part of the magnetic resonance signals is performed with at least one phase encoding gradient of the plurality of phase encoding gradients for the phase encoding in the slice selection direction with a moment equal to zero, and
    wherein the acquisition of the second part of the magnetic resonance signals is performed with at least one phase encoding gradient of the plurality of phase encoding gradients for the phase encoding in the slice selection direction with a moment unequal to zero.

11. The method of claim 1, wherein generating the preview image is performed using a linear transformation.

12. The method of claim 11, wherein the linear transformation includes a fast Fourier transformation, a PAT reconstruction, or a combination thereof.

13. The method of claim 2, wherein the generation of the second image is performed according to an iterative reconstruction method.

14. The method of claim 2, wherein the generation of the second image is performed according to a SEMAC method, a MAVRIC method, or a combination thereof.

15. The method of claim 2, wherein the acquiring of the first part of the magnetic resonance signals, the acquiring of the second part of the magnetic resonance signals, the generating of the preview image using the first part of the magnetic resonance signals, the storing of the second part of the magnetic resonance signals or the storing of the second part and the subset of the first part of the magnetic resonance signals for the generation of the second image, and generating of a second image using the second part of the magnetic resonance signals or the second part and the subset of the first part of the magnetic resonance signals are performed for different slices of an object to be examined, and wherein a slice coverage of a respective preview image is the same as a slice coverage of a respective second image.

16. A magnetic resonance device for generation of a preview image of a region under examination using magnetic resonance signals, the magnetic resonance device comprising:

a radio-frequency antenna unit configured to acquire a first part and a second part of the magnetic resonance signals;

a system control unit configured to perform a pulse sequence with regular sampling of a first k-space volume for the acquisition of the first part of the magnetic resonance signals and pseudorandomized sampling of a second k-space volume for the acquisition of the second part of the magnetic resonance signals and to generate a preview image using only the first part of the magnetic resonance signals, the preview image being displayed to an operator of the magnetic resonance device such that an image quality of the preview image is evaluatable in order to determine whether the acquisition of the first part of the magnetic resonance signals or the acquisition of the second part of the magnetic resonance signals needs to be repeated, wherein the generation of the preview image is performed at least partially at a same time as the acquisition of the second part of the magnetic resonance signals.

17. In a non-transitory computer-readable storage medium storing instructions executable by a system controller of a magnetic resonance device to generate a preview image of a region under examination using magnetic resonance signals, the instructions comprising:

acquiring a first part of the magnetic resonance signals;
acquiring a second part of the magnetic resonance signals;
generating a preview image using only the first part of the magnetic resonance signals, the preview image being displayed to an operator of the magnetic resonance device such that an image quality of the preview image is evaluatable in order to determine whether the acquiring of the first part of the magnetic resonance signals or the acquiring of the second part of the magnetic resonance signals needs to be repeated; and
storing the second part of the magnetic resonance signals or storing the second part and a subset of the first part of the magnetic resonance signals for generation of a second image,
wherein during the acquiring of the first part of the magnetic resonance signals, a first part of a k-space is regularly sampled, and during the acquiring of the second part of the magnetic resonance signals, a second part of the k-space is sampled in a pseudorandomized manner.

18. The method of claim 1, further comprising determining whether image correction of the second image is needed based on the acquired data quality of the first part, the second part, or the first part and the second part of the magnetic resonance signals.

19. The method of claim 1, wherein the image quality of the preview image is indicative of data quality of the acquired first part, the acquired second part, or the acquired first part and the acquired second part of the magnetic resonance signals.

* * * * *